(12) United States Patent
Omura et al.

(10) Patent No.: US 11,237,279 B2
(45) Date of Patent: Feb. 1, 2022

(54) RADIOGRAPHIC APPARATUS

(71) Applicant: CANON KABUSHIKI KAISHA, Tokyo (JP)

(72) Inventors: Satoru Omura, Chigasaki (JP); Motoki Tagawa, Chigasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 111 days.

(21) Appl. No.: 16/700,907

(22) Filed: Dec. 2, 2019

(65) Prior Publication Data
US 2020/0183020 A1 Jun. 11, 2020

(30) Foreign Application Priority Data
Dec. 6, 2018 (JP) .............................. JP2018-228820

(51) Int. Cl.
*G01T 1/24* (2006.01)
*G01T 1/20* (2006.01)
*H04N 5/30* (2006.01)
*H05K 9/00* (2006.01)

(52) U.S. Cl.
CPC ............ *G01T 1/2006* (2013.01); *G01T 1/244* (2013.01); *H04N 5/30* (2013.01); *H05K 9/0009* (2013.01); *H05K 9/0049* (2013.01)

(58) Field of Classification Search
CPC .............................. G01T 1/244; H05K 9/0049
See application file for complete search history.

(56) References Cited

U.S. PATENT DOCUMENTS

2015/0309194 A1 10/2015 Sumi
2018/0110163 A1* 4/2018 Furutani ............ H05K 13/0084
2019/0018151 A1* 1/2019 Kawaguchi .............. A61B 6/00

FOREIGN PATENT DOCUMENTS

| JP | 2000-258541 A | 9/2000 |
|----|---------------|--------|
| JP | 2008-209294 A | 9/2008 |
| JP | 2009-238813 A | 10/2009 |

* cited by examiner

*Primary Examiner* — Hung V Ngo
(74) *Attorney, Agent, or Firm* — Canon U.S.A., Inc. IP Division

(57) ABSTRACT

A radiographic apparatus includes a sensor panel that obtains a radiographic image by converting radiation incident thereon into an electric signal, a sensor support base that supports the sensor panel, and a housing that houses the sensor panel and the sensor support base therein. The housing includes a stack structure including a first conductor layer, a second conductor layer electrically connected to the first conductor layer via an electric connection member, and a nonconductor layer disposed between the first conductor layer and the second conductor layer.

10 Claims, 7 Drawing Sheets

RADIOGRAPHIC APPARATUS

BACKGROUND

Field of the Disclosure

The present disclosure relates to a radiographic apparatus that performs imaging using radiation.

Description of the Related Art

In recent years, digital radiographic apparatuses that use a radiation detector such as digital radiography (DR), which displays a radiographic image immediately on a monitor, have been widely used. A portable radiation detector should be lightweight and have high noise resistance.

For example, Japanese Patent Laid-Open No. 2000-258541 discloses a technology for shielding electromagnetic waves by electrically connecting a conductive cover portion and a metal housing, which constitute an enclosure of a radiation detector, by using a conductive sealing member.

In a hospital, various medical apparatuses exist. In particular, in a treatment room, a radiation detector is used among a large number of medical apparatuses. Some of the medical apparatuses emit electromagnetic waves. If an enclosure of the radiation detector has a metal portion having a floating potential, electromagnetic noise is generated and the noise resistance of the radiation detector deteriorates, and consequently it may not be possible to obtain a clear radiographic image with low noise.

In the radiation detector described in Japanese Patent Laid-Open No. 2000-258541, the entirety of the enclosure of the radiation detector is made of a conductive material or a metal material. Therefore, the radiation detector has a problem in that the weight of the detector tends to be large and it is difficult to reduce the weight and consequently portability decreases.

SUMMARY

Various embodiments address such problems and provides a radiographic apparatus that can realize weight reduction while maintaining high noise resistance.

Some embodiments of a radiographic apparatus include a sensor panel that obtains a radiographic image by converting radiation incident thereon into an electric signal, and a housing that houses the sensor panel therein. The housing includes a stack structure including a first conductor layer, a second conductor layer electrically connected to the first conductor layer via an electric connection member, and a nonconductor layer disposed between the first conductor layer and the second conductor layer.

Further features of various embodiments will become apparent from the following description of exemplary embodiments with reference to the attached drawings.

DESCRIPTION OF THE EMBODIMENTS

Hereafter, exemplary embodiments will be described with reference to the drawings.

First Embodiment

First, a first embodiment will be described.

Figure 1:
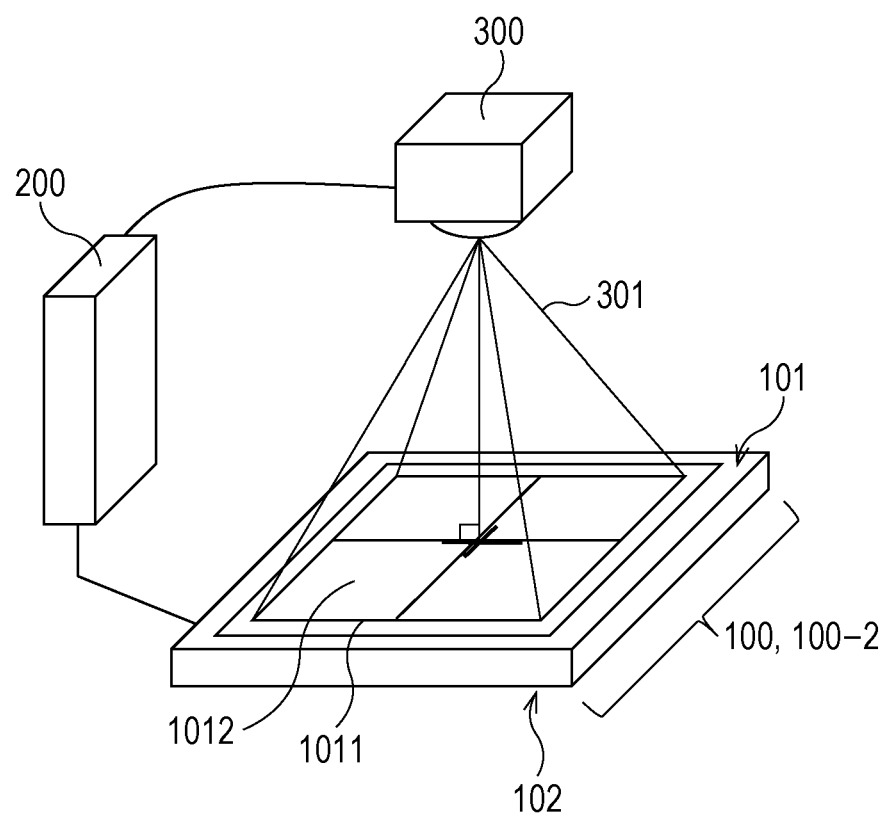
FIG. 1 is a schematic view illustrating an example of the structure of a radiographic apparatus according to a first embodiment.

FIG. 1 is a schematic view illustrating an example of the structure of a radiographic apparatus 10 according to the first embodiment. As illustrated in FIG. 1, the radiographic apparatus 10 includes a radiation detector 100, a controller 200, and a radiation generator 300.

The radiation generator 300 includes a radiation tube that generates radiation. The radiation generator 300 is controlled by the controller 200 to emit radiation 301 toward the radiation detector 100. At this time, although not illustrated in FIG. 1, an imaging target, such as a subject to be radiographed, can be placed between the radiation generator 300 and the radiation detector 100.

The controller 200 integrally controls the operation of the radiographic apparatus 10 and performs various processing operations. For example, when radiographing an imaging target, the controller 200 controls the radiation generator 300 to emit the radiation 301, and controls the radiation detector 100 to obtain a radiographic image based on incident radiation (including radiation that has passed through the imaging target). The controller 200 can perform various image processing operations as necessary by obtaining the radiographic image from the radiation detector 100.

The radiation detector 100 is disposed at a position facing the radiation generator 300 (the radiation tube). The radiation detector 100 is controlled by the controller 200 to convert incident radiation (including the radiation that has passed through the imaging target) into an electric signal. In FIG. 1, in a housing, which constitutes the enclosure of the radiation detector 100, a surface that is located on a side on which the radiation 301 is incident is shown as a first surface 101, and a surface that is located on a side opposite from the first surface 101 is shown as a second surface 102. In FIG. 1, in the radiation detector 100, a boundary of the first surface 101 within which the radiation 301 is detectable is shown as a boundary line 1011. In FIG. 1, the radiation detector 100 detects the radiation 301 that is emitted toward a blank region inside the boundary line 1011, which is shown as an effective imaging region 1012 related to radiography.

Figure 2:
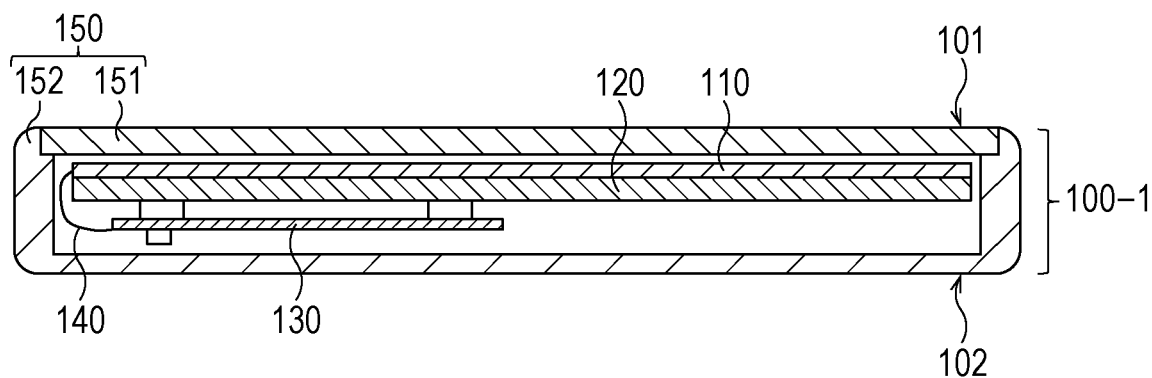
FIG. 2 is a sectional view illustrating an example of the internal structure of a radiation detector according to the first embodiment.

FIG. 2 is a sectional view illustrating an example of the internal structure of the radiation detector 100 according to the first embodiment. In FIG. 2, elements that are similar to those shown in FIG. 1 are denoted by the same numerals. To be specific, in FIG. 2, the first surface 101, which is located on the side on which the radiation 301 is incident, is shown at an upper position, and the second surface 102, which is located on the side opposite from the first surface 101, is shown at a lower position. In the following description, the radiation detector 100 according to the first embodiment will be referred to as "radiation detector 100-1".

As illustrated in FIG. 2, the radiation detector 100-1 includes a sensor panel 110, a sensor support base 120, an electric substrate 130, a cable 140, and a housing 150.

The sensor panel 110 obtains a radiographic image by converting radiation incident thereon into an electric signal. The sensor panel 110 includes, on the upper surface or the lower surface thereof, a scintillator that is a phosphor, such as CsI or GOS, which generates light in reaction to the radiation 301. The sensor panel 110 includes a sensor pixel array that detects light generated by the scintillator and converts the light into an electric signal. In the sensor panel 110, the sensor pixel array is formed on a glass substrate or a resin substrate.

The sensor support base 120 supports the sensor panel 110. The sensor support base 120 is fixed to the sensor panel 110 so as to be in surface contact with the sensor panel 110. A member having low radiation transmittance may be disposed between the sensor support base 120 and the sensor panel 110. The sensor support base 120 may be omitted, and the sensor panel 110 may be directly supported by a bottom surface or a side surface of the housing 150.

The electric substrate 130 controls the sensor panel 110 via the cable 140. The electric substrate 130 is disposed so as to face the sensor panel 110 with the sensor support base 120 therebetween.

The cable 140 connects the sensor panel 110 and the electric substrate 130 so that electric communication can be performed therebetween.

The housing 150 constitutes the enclosure of the radiation detector 100-1 and houses the sensor panel 110, the sensor support base 120, the electric substrate 130, and the cable 140 therein. The housing 150 has a function of protecting the contents from external force and noise. As illustrated in FIG. 2, the housing 150 includes a top plate 151 and a cover portion 152. As illustrated in FIG. 2, the top plate 151 is disposed in the housing 150 at the first surface 101 that is located on the side on which the radiation 301 is incident. CFRP is generally used as the material of the top plate 151, because the top plate 151 needs to have high transmittance for the radiation 301 and needs to have the function of protecting the contents from external forces and the like.

Figure 3:
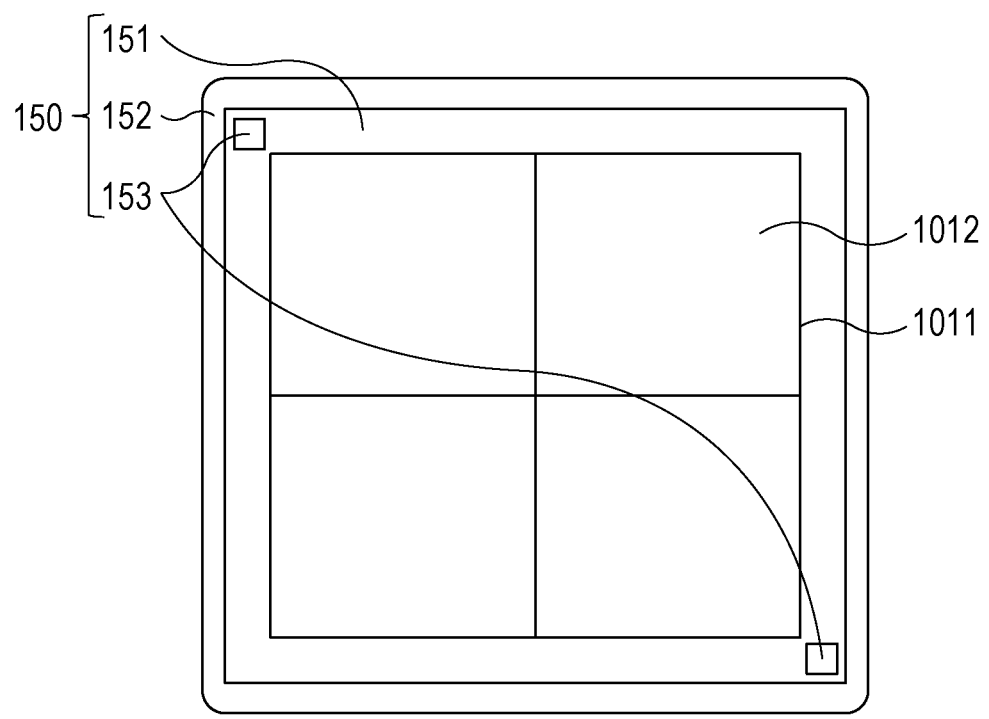
FIG. 3 is front view illustrating the radiation detector according to the first embodiment as seen from a side on which radiation is incident.

FIG. 3 is front view illustrating the radiation detector 100-1 according to the first embodiment as seen from the side on which the radiation 301 is incident. In FIG. 3, elements that are similar to those illustrated in FIGS. 1 and 2 are denoted by the same numerals. In the present embodiment, as illustrated in FIG. 3, the housing 150 further includes electric connection members 153, in addition to the top plate 151 and the cover portion 152 illustrated in FIG. 2.

Figure 4:
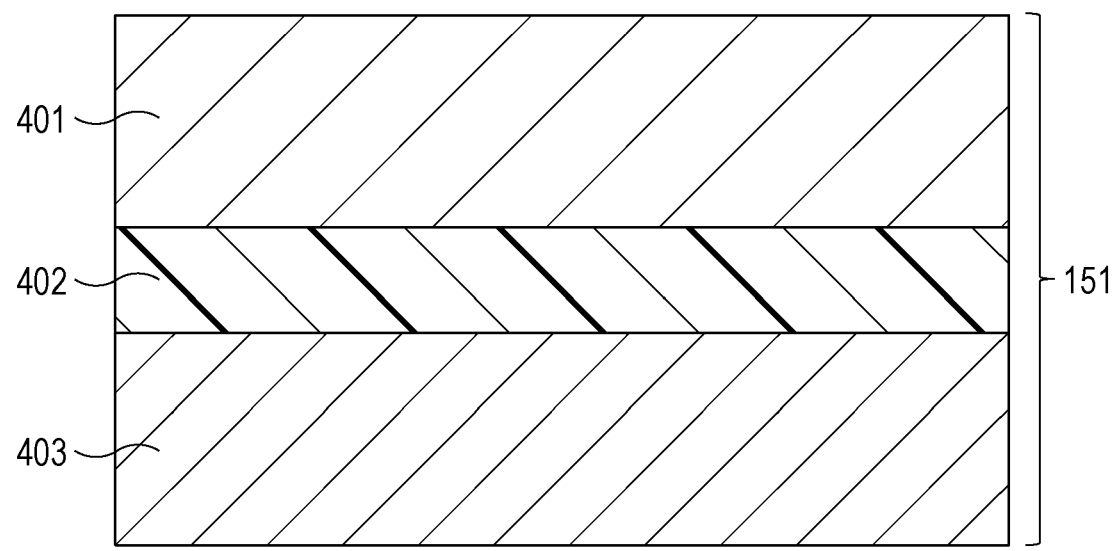
FIG. 4 is a sectional view illustrating an example of the internal structure of a top plate illustrated in FIGS. 2 and 3.

FIG. 4 is a sectional view illustrating an example of the internal structure of the top plate 151 illustrated in FIGS. 2 and 3.

In the present embodiment, the top plate 151 includes a stack structure including, for example, a first conductor layer 401 located on a side of the first surface 101 illustrated in FIG. 2, a second conductor layer 403 electrically connected to the first conductor layer 401 via the electric connection members 153 illustrated in FIG. 3, and a nonconductor layer 402 disposed between the first conductor layer 401 and the second conductor layer 403.

In the present embodiment, the first conductor layer 401 and the second conductor layer 403 each may be a layer including a material that is one of aluminum, magnesium, titanium, iron, and carbon. By using such a material having high specific strength for the first conductor layer 401 and the second conductor layer 403, in a case where the radiation detector 100-1 is a portable detector, the weight of the detector can be reduced to improve the portability for a user. The first conductor layer 401 and the second conductor layer 403 may be connected to each other at end portions thereof, or may be structured so as to cover the nonconductor layer 402.

As illustrated in FIG. 4, the nonconductor layer 402 is in close contact with each of the first conductor layer 401 and the second conductor layer 403 to form a high-rigidity integrated stack structure. Here, in the present embodiment, the nonconductor layer 402 may be a layer including a resin material in view of weight reduction. Although the weight can be further reduced if the nonconductor layer 402 is a foam member, both of weight reduction and improvement of shock resistance of the top plate 151 can be achieved by disposing a high-density resin plate.

Figure 5A:
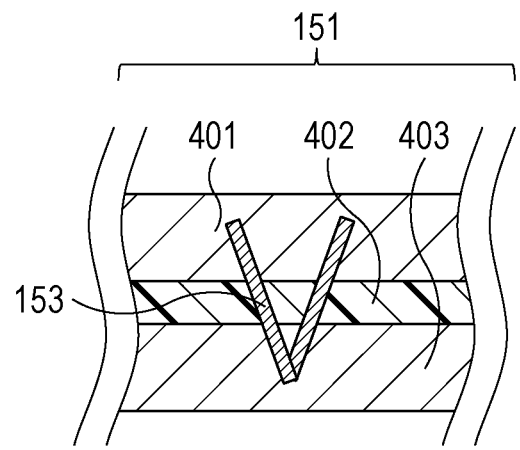
FIGS. 5A to 5C are sectional views of the first embodiment, illustrating examples of the arrangement of the top plate illustrated in FIG. 4 and an electric connection member illustrated in FIG. 3.
Figure 5B:
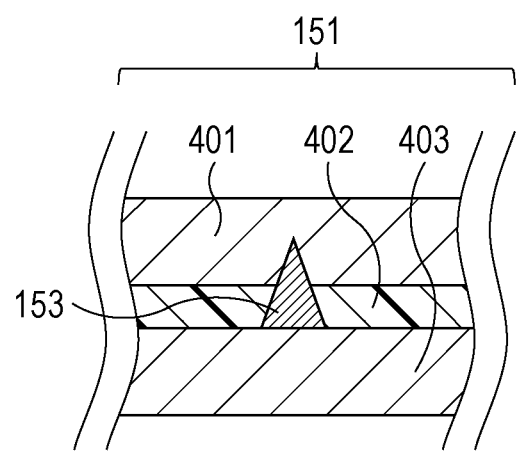
Figure 5C:
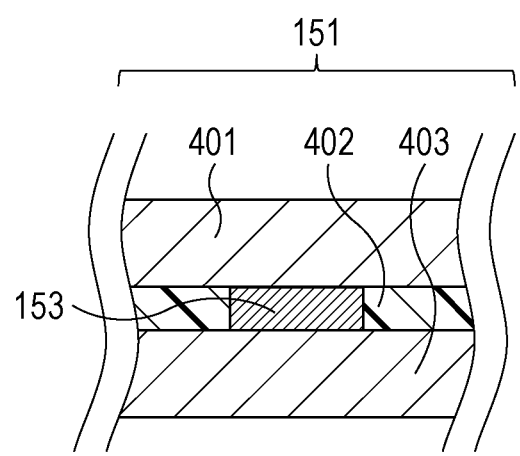

FIGS. 5A to 5C are sectional views of the first embodiment, illustrating examples of the arrangement of the top plate 151 illustrated in FIG. 4 and one of the electric connection members 153 illustrated in FIG. 3. In FIGS. 5A to 5C, elements that are similar to those illustrated in FIGS. 3 and 4 are denoted by the same numerals. In a case where the first conductor layer 401 and the second conductor layer 403 are made of CFRP, the thickness of each of the conductor layers may be larger than 0.15 mm, and the thickness of the top plate 151 is in the range of 0.6 mm to 3.0 mm.

To be specific, FIG. 5A illustrates an example in which a V-shaped electric connection member 153, which electrically connects the first conductor layer 401 and the second conductor layer 403, is disposed so as to penetrate into both of the first conductor layer 401 and the second conductor layer 403. A configuration such that an electric connection member 153 having a V-shape that is inverted from the V-shape shown in FIG. 5A is disposed in the top plate 151 is also applicable to the present embodiment.

FIG. 5B illustrates an example in which a wedge-shaped electric connection member 153, which electrically connects the first conductor layer 401 and the second conductor layer 403, is disposed so that one end thereof penetrates into the first conductor layer 401 and the other end thereof is in surface contact with the second conductor layer 403. A configuration such that an electric connection member 153 having a wedge-shape that is inverted from the wedge-shape shown in FIG. 5B is disposed so that one end thereof penetrates into the second conductor layer 403 and the other end thereof is in surface contact with the first conductor layer 401 is disposed in the top plate 151 is also applicable to the present embodiment.

FIG. 5C illustrates an example in which a rectangular-parallelepiped-shaped electric connection member 153, which electrically connects the first conductor layer 401 and the second conductor layer 403, is disposed so as to be in surface contact with both of the first conductor layer 401 and the second conductor layer 403.

The material and connection method of the electric connection member 153 may be appropriately selected in accordance with the materials and the surface conditions of the first conductor layer 401, the second conductor layer 403, and the nonconductor layer 402. The shape of the electric connection member 153 is not limited to the patterns illustrated in FIGS. 5A to 5C. As long as it is possible to electrically connect the first conductor layer 401 and the second conductor layer 403, the electric connection member 153 may have other shapes or may use other methods. Here, in the present embodiment, "electrical connection" refers to connection having an electric resistance of several hundred ohms or lower. Electromagnetic-shielding ability increases as the electric resistance decreases. In the present embodiment, in the top plate 151 of the housing 150, the nonconductor layer 402 is disposed between the first conductor layer 401 and the second conductor layer 403, and the electric connection member 153, which electrically connects the first conductor layer 401 and the second conductor layer 403, is disposed. With such a structure, electromagnetic noise can be suppressed because the conductor layers of the top plate 151 do not have an independent electric potential and floating of electric potential does not occur, and it is possible to provide the radiation detector 100-1 (the radiographic apparatus 10) that has improved noise resistance.

The electric connection member 153 may be a conductive metal piece and may be disposed as follows.

For example, as illustrated in FIG. 3, the electric connection member 153 is disposed outside of the effective imaging region 1012 related to radiographic imaging using the radiation. With such a structure, an image of a metal that has low radiation transmittance is not included in a radiographic image, and a good radiographic image can be obtained. Moreover, as illustrated in FIG. 3, a plurality of the electric connection members 153 are disposed at diagonal positions in the housing 150 when the housing 150 is seen from the side on which the radiation 301 is incident. With such a structure, electrical connection can be more stably performed, and sustainable improvement of noise resistance can be realized.

Figure 6A:
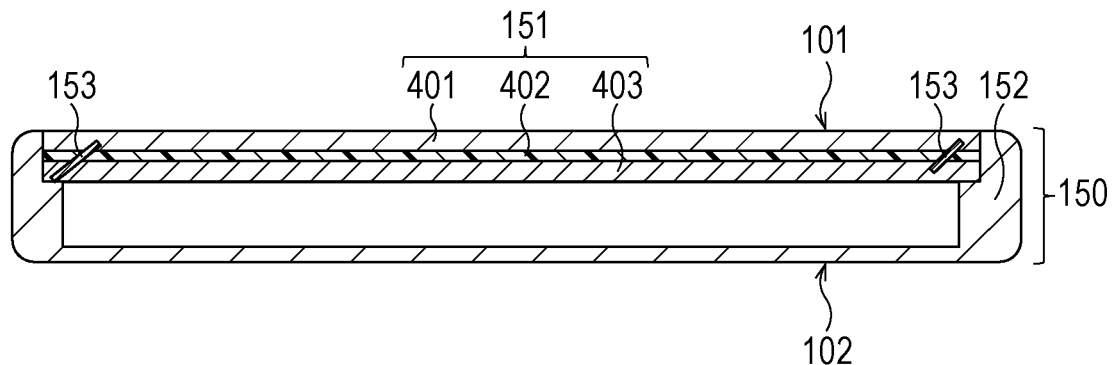
FIGS. 6A to 6C are sectional views illustrating examples of the schematic structure of a housing according to the first embodiment.
Figure 6B:
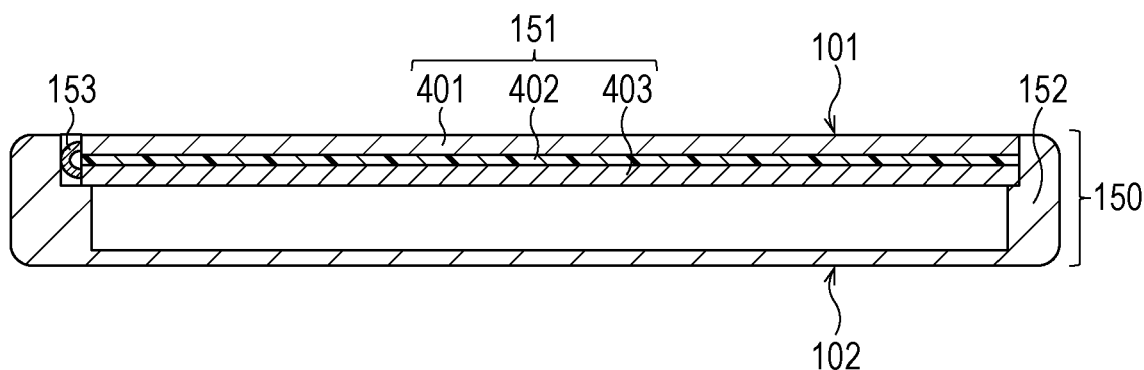
Figure 6C:
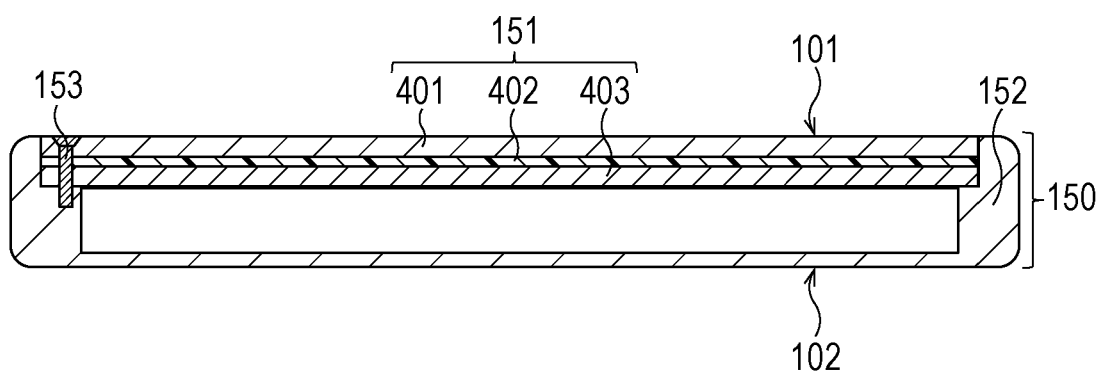

FIGS. 6A to 6C are sectional views illustrating examples of the schematic structure of the housing 150 according to the first embodiment. In FIGS. 6A to 6C, elements that are similar to those illustrated FIGS. 1 to 5C are denoted by the same numerals. In the present embodiment, as illustrated in FIGS. 6A to 6C, in the housing 150, the top plate 151, which is located at the first surface 101, has a stack structure including the first conductor layer 401, the nonconductor layer 402, and the second conductor layer 403.

In the housing 150 illustrated in each of FIGS. 6A to 6C, the cover portion 152, which is a portion excluding the top plate 151 having the stack structure (a portion in which the stack structure is not provided) is formed of a conductor. Conductor parts of the cover portion 152 are electrically connected to each other. In the present embodiment, the electric connection member 153 electrically connects the top plate 151 and the cover portion 152 further.

To be specific, FIG. 6A illustrates an example in which electric connection members 153 that are metal pieces are embedded in the top plate 151. To be more specific, in FIG. 6A, the electric connection members 153, which are metal pieces, are disposed so as to penetrate from the first conductor layer 401 into the second conductor layer 403 and to be in contact with the cover portion 152. Thus, the electric connection members 153, which are metal pieces, electrically connect the first conductor layer 401, the second conductor layer 403, and the cover portion 152 to one another.

In FIG. 6B, an electric connection member 153, which is a plate-spring-like component, is disposed so as to be in contact with the first conductor layer 401, the second conductor layer 403, and the cover portion 152, at a side surface of the top plate 151. Thus, the electric connection member 153, which is a plate-spring-like component, electrically connects the first conductor layer 401, the second conductor layer 403, and the cover portion 152 to one another.

In FIG. 6C, an electric connection member 153, which is a countersunk screw, is disposed so as to be in contact with the first conductor layer 401, the second conductor layer 403, and the cover portion 152. Thus, the electric connection member 153, which is a countersunk screw, electrically connects the first conductor layer 401, the second conductor layer 403, and the cover portion 152 to one another.

As described above with reference to FIGS. 6A to 6C, by electrically connecting the top plate 151 and the cover portion 152 further by using the electric connection member 153, no part of the housing 150 has an independent electric potential, and floating of electric potential does not occur. Thus, electromagnetic noise can be further suppressed, and it is possible to provide a radiation detector 100-1 that has further improved noise resistance. Moreover, because the electric connection member 153 not only electrically connects the first conductor layer 401 and the second conductor layer 403 of the top plate 151 but also electrically connects the top plate 151 and the cover portion 152, it is possible to form a plurality of electrical connections by using only one component and to form efficient and stable electrical connection.

As described above, in the radiation detector 100-1 of the radiographic apparatus 10 according to the first embodiment, the top plate 151, which is located at the first surface 101 of the housing 150, has the stack structure. That is, the top plate 151 has the stack structure including the first conductor layer 401, the second conductor layer 403 electrically connected to the first conductor layer 401 via the electric connection members 153, and the nonconductor layer 402 disposed between the first conductor layer 401 and the second conductor layer 403.

With such a structure, it is possible to provide the radiographic apparatus 10 (the radiation detector 100) that can realize weight reduction while maintaining high noise resistance. If, for example, a top plate is formed from only conductor layers without including the nonconductor layer 402 shown in the present embodiment, it is not possible to use resin and foam, which are nonconductive materials that contribute to weight reduction, and thus weight is increased, and consequently, portability is expected to decrease.

Second Embodiment

Next, a second embodiment will be described. In the following description of the second embodiment, differences from the first embodiment will be described, while omitting description of matters that are the same as those of the first embodiment.

The schematic structure of a radiographic apparatus according to the second embodiment is similar to that of the radiographic apparatus 10 according to the first embodiment illustrated in FIG. 1. In the following description, a radiation detector 100 according to the second embodiment will be referred to as "radiation detector 100-2". Except for the housing 150, the internal structure of the radiation detector 100-2 according to the second embodiment is similar to that of the radiation detector 100-1 according to the first embodiment illustrated in FIG. 2. Descriptions of the similar parts will be omitted. Hereafter, a housing according to the second embodiment, which is the difference from the first embodiment, will be described.

Figure 7A:
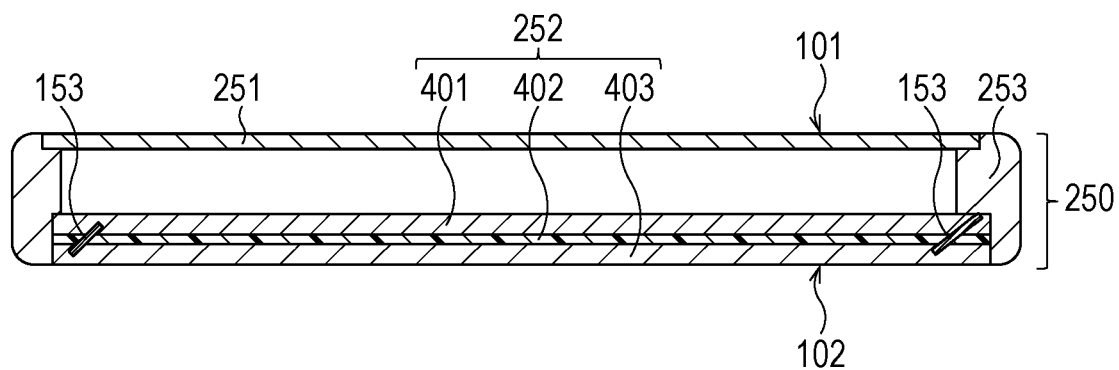
FIGS. 7A to 7C are sectional views illustrating examples of the schematic structure of a housing according to a second embodiment.
Figure 7B:
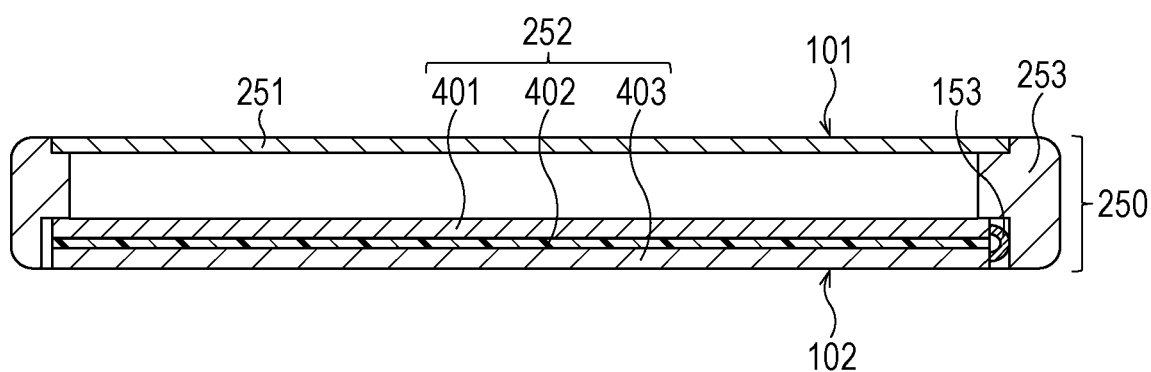
Figure 7C:
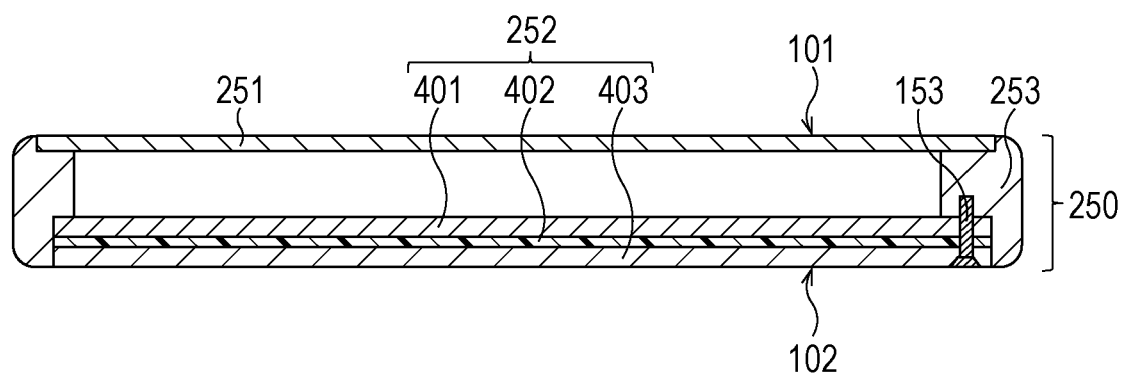

FIGS. 7A to 7C are sectional views illustrating examples of the schematic structure of a housing 250 according to the second embodiment. In FIGS. 7A to 7C, elements that are similar to those illustrated in FIGS. 1 to 6C are denoted by the same numerals. In the present embodiment, as illustrated in FIGS. 7A to 7C, the housing 250 includes a top plate 251 located at a first surface 101, a back plate 252 located at a second surface 102, an electric connection member 153, and a cover portion 253 that connects the top plate 251 and the back plate 252 at side surfaces of the housing 250.

To be specific, in the present embodiment, in the housing 250, the back plate 252, which is located at the second surface 102, has a stack structure including a first conductor layer 401, a nonconductor layer 402, and a second conductor layer 403. In the back plate 252, the electric connection member 153, which electrically connects the first conductor layer 401 and the second conductor layer 403, is disposed. That is, the back plate 252 has the stack structure described in the first embodiment.

The top plate 251 may be formed of a single CFRP plate or a resin plate. The top plate 151 described in the first embodiment, which has the stack structure, may be used.

The cover portion 253 is formed of a conductor. Conductor parts of the cover portion 253 are electrically connected to each other. In the present embodiment, the electric connection member 153 electrically connects at least the back plate 252 and the cover portion 253 further.

To be specific, FIG. 7A illustrates an example in which electric connection members 153 that are metal pieces are embedded in the back plate 252. To be more specific, in FIG. 7A, the electric connection members 153, which are metal pieces, are disposed so as to penetrate from the first conductor layer 401 into the second conductor layer 403 and to be in contact with the cover portion 253. Thus, the electric connection members 153, which are metal pieces, electrically connect the first conductor layer 401, the second conductor layer 403, and the cover portion 253 to one another.

In FIG. 7B, an electric connection member 153, which is a plate-spring-like component, is disposed so as to be in contact with the first conductor layer 401, the second conductor layer 403, and the cover portion 253, at a side surface of the back plate 252. Thus, the electric connection member 153, which is a plate-spring-like component, electrically connects the first conductor layer 401, the second conductor layer 403, and the cover portion 253 to one another.

In FIG. 7C, an electric connection member 153, which is a countersunk screw, is disposed so as to be in contact with the first conductor layer 401, the second conductor layer 403, and the cover portion 253. Thus, the electric connection member 153, which is a countersunk screw, electrically connects the first conductor layer 401, the second conductor layer 403, and the cover portion 253 to one another.

As described above with reference to FIGS. 7A to 7C, by electrically connecting the back plate 252 and the cover portion 253 further by using the electric connection member 153, no part of the housing 250 has an independent electric potential, and floating of electric potential does not occur. Thus, electromagnetic noise can be further suppressed, and it is possible to provide the radiation detector 100-2 that has further improved noise resistance. Moreover, because the electric connection member 153 not only electrically connects the first conductor layer 401 and the second conductor layer 403 of the back plate 252 but also electrically connects the back plate 252 and the cover portion 253, it is possible to form a plurality of electrical connections by using only one component and to form efficient and stable electrical connection.

As described above, in the radiation detector 100-2 of the radiographic apparatus 10 according to the second embodiment, the back plate 252, which is located at the second surface 102 of the housing 250, has the stack structure. That is, the back plate 252 has the stack structure including the first conductor layer 401, the second conductor layer 403 electrically connected to the first conductor layer 401 via the electric connection members 153, and the nonconductor layer 402 disposed between the first conductor layer 401 and the second conductor layer 403.

With such a structure, it is possible to provide the radiographic apparatus 10 (the radiation detector 100) that can realize weight reduction while maintaining high noise resistance. If, for example, a back plate is formed from only conductor layers without including the nonconductor layer 402 shown in the present embodiment, it is not possible to use resin and foam, which are nonconductive materials that contribute to weight reduction, and thus weight is increased, and consequently, portability is expected to decrease.

Third Embodiment

Next, a third embodiment will be described. In the following description of the third embodiment, differences from the first and second embodiments will be described, while omitting description of matters that are the same as those of the first and second embodiments.

The schematic structure of a radiographic apparatus according to the third embodiment is similar to that of the radiographic apparatus 10 according to the first embodiment illustrated in FIG. 1.

Figure 8:
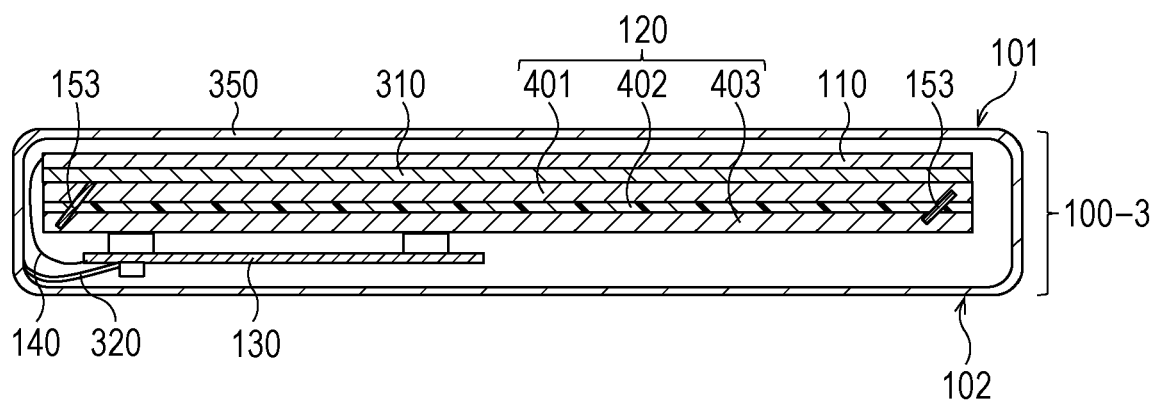
FIG. 8 is a sectional view illustrating an example of the internal structure of a radiation detector according to a third embodiment.

FIG. 8 is a sectional view illustrating an example of the internal structure of the radiation detector 100 according to the third embodiment. In FIG. 8, elements that are similar to those illustrated in FIGS. 1 to 7C are denoted by the same numerals. In the following description, a radiation detector 100 according to the third embodiment will be referred to as "radiation detector 100-3".

As illustrated in FIG. 8, the radiation detector 100-3 includes a sensor panel 110, a sensor support base 120, an electric substrate 130, a cable 140, an electric connection member 153, a panel coupling layer 310, a cable 320, and a housing 350.

To be specific, in the present embodiment, the sensor support base 120 has a stack structure including a first conductor layer 401, a nonconductor layer 402, and a second conductor layer 403. In the sensor support base 120, the electric connection member 153, which electrically connects the first conductor layer 401 and the second conductor layer 403, is disposed. That is, the sensor support base 120 has a stack structure similar to that of the top plate 151 described in the first embodiment or the back plate 252 described in the second embodiment.

The housing 350 is formed of a conductor. However, the housing 350 may have a stack structure similar to that of the top plate 151 described in the first embodiment or the back plate 252 described in the second embodiment. Conductor parts of the housing 350 are electrically connected to each other.

The panel coupling layer 310 is a layer that is disposed between the sensor panel 110 and the sensor support base 120 described in the first embodiment and that includes a member having low transmittance for the radiation 301. The panel coupling layer 310 further includes a double-sided tape or an adhesive layer that fixes components to each other.

The sensor support base 120 is electrically connected to the electric substrate 130. Here, an electrical connection is formed by using a general method, such as connection via a fastening screw for fixing the electric substrate. The electric substrate 130 is electrically connected to the housing 350 via the cable 320. That is, in the present embodiment, the sensor support base 120 is connected to a conductor portion of the housing 350 via an electrical connection mechanism including the fastening screw, the electric substrate 130, and the cable 320. By electrically connecting the sensor support base 120 and the housing 350 via the electrical connection mechanism in this way, it is easy to place an antistatic component, which protects the electric substrate 130 against static electricity from the housing 350, on the electric substrate 130. By electrically connecting the sensor support base 120 and the housing 350 via the electrical connection mechanism, no part of the housing 350 has an independent electric potential, and floating of electric potential does not occur. Thus, electromagnetic noise can be further suppressed, and it is possible to provide the radiation detector 100-3 that has further improved noise resistance.

As described above, in the radiation detector 100-3 of the radiographic apparatus 10 according to the third embodiment, the sensor support base 120 has the stack structure. That is, the sensor support base 120 has the stack structure including the first conductor layer 401, the second conductor layer 403 electrically connected to the first conductor layer 401 via the electric connection members 153, and the nonconductor layer 402 disposed between the first conductor layer 401 and the second conductor layer 403. With such a structure, it is possible to provide the radiographic apparatus 10 (the radiation detector 100) that can realize weight reduction while maintaining high noise resistance.

Fourth Embodiment

Next, a fourth embodiment will be described. In the following description of the fourth embodiment, differences from the first to third embodiments will be described, while omitting description of matters that are the same as those of the first to third embodiments.

Here, the fourth embodiment is a combination of the first to third embodiments.

A first aspect of the fourth embodiment is a combination of the first embodiment and the second embodiment. In the first aspect, for example, the housing 150 of the radiation detector 100-1 illustrated in FIG. 2 may include the top plate 151 and the electric connection member 153 illustrated in any one of FIGS. 6A to 6C and the back plate 252 and the electric connection member 153 illustrated in any one of FIGS. 7A to 7C.

A second aspect of the fourth embodiment is a combination of the first embodiment or the second embodiment and the third embodiment. In the second aspect, for example, the housing 350 of the radiation detector 100-3 illustrated in FIG. 8 may include the top plate 151 and the electric connection member 153 illustrated in any one of FIGS. 6A to 6C or the back plate 252 and the electric connection member 153 illustrated in any one of FIGS. 7A to 7C.

A third aspect of the fourth embodiment is a combination of the first embodiment, the second embodiment, and the third embodiment. In the third aspect, for example, the housing 350 of the radiation detector 100-3 illustrated in FIG. 8 may include the top plate 151 and the electric connection member 153 illustrated in any one of FIGS. 6A to 6C and the back plate 252 and the electric connection member 153 illustrated in any one of FIGS. 7A to 7C.

As described above in the first to fourth embodiments, at least one of the housing and the sensor support base 120 of the radiation detector 100 may have a stack structure including the first conductor layer 401, the second conductor layer 403 electrically connected to the conductor layer via the electric connection member 153, and the nonconductor layer 402 disposed between these two conductor layers 401 and 403.

With various embodiments, it is possible to provide a radiographic apparatus that can realize weight reduction while maintaining high noise resistance.

While the present disclosure has described exemplary embodiments, it is to be understood that various embodiments are not limited to the disclosed exemplary embodiments. The scope of the following claims is to be accorded the broadest interpretation so as to encompass all such modifications and equivalent structures and functions.

This application claims priority to Japanese Patent Application No. 2018-228820, which was filed on Dec. 6, 2018 and which is hereby incorporated by reference herein in its entirety.

What is claimed is:

1. A radiographic apparatus comprising:
a sensor panel that obtains a radiographic image by converting radiation incident thereon into an electric signal; and
a housing that houses the sensor panel therein,
wherein the housing includes a stack structure including
a first conductor layer,
a second conductor layer electrically connected to the first conductor layer via an electric connection member, and
a nonconductor layer disposed between the first conductor layer and the second conductor layer.

2. The radiographic apparatus according to claim 1, further comprising:
a sensor support base that supports the sensor panel,
wherein the sensor support base has the stack structure.

3. The radiographic apparatus according to claim 2,
wherein the sensor support base is electrically connected to a conductor portion of the housing via an electrical connection mechanism.

4. The radiographic apparatus according to claim 1,
wherein the housing includes
a top plate having an incident surface on which radiation is incident, and
a cover portion having a back surface facing the incident surface and a side surface located between the incident surface and the back surface, and
wherein the top plate has the stack structure.

5. The radiographic apparatus according to claim 4,
wherein the cover portion has conductivity, and
wherein the electric connection member is electrically connected also to the cover portion.

6. The radiographic apparatus according to claim 1,
wherein the housing includes
a top plate having an incident surface on which radiation is incident, and
a cover portion having a back surface facing the incident surface and a side surface located between the incident surface and the back surface, and
wherein the back surface has the stack structure.

7. The radiographic apparatus according to claim 1,
wherein the electric connection member is disposed outside of an effective imaging region related to radiographic imaging using the radiation.

8. The radiographic apparatus according to claim 1, wherein a plurality of the electric connection members are disposed at diagonal positions in the housing when the housing is seen from a side on which the radiation is incident.

9. The radiographic apparatus according to claim 1, wherein the first conductor layer and the second conductor layer are each a layer including a material that is one of aluminum, magnesium, titanium, iron, and carbon.

10. The radiographic apparatus according to claim 1, wherein the nonconductor layer is a layer including a resin material.

* * * * *